US012804941B2

(12) United States Patent
Yoshida

(10) Patent No.: US 12,804,941 B2
(45) Date of Patent: Nov. 17, 2026

(54) SEMICONDUCTOR DEVICE

(71) Applicant: SUMITOMO ELECTRIC INDUSTRIES, LTD., Osaka (JP)

(72) Inventor: Shigeki Yoshida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 307 days.

(21) Appl. No.: 18/813,371

(22) Filed: Aug. 23, 2024

(65) Prior Publication Data

US 2025/0081503 A1 Mar. 6, 2025

(30) Foreign Application Priority Data

Aug. 31, 2023 (JP) ................................ 2023-141122
Sep. 29, 2023 (JP) ................................ 2023-169715

(51) Int. Cl.

| | |
|---|---|
| ***H01L 29/778*** | (2006.01) |
| ***H10D 30/01*** | (2025.01) |
| ***H10D 30/47*** | (2025.01) |
| ***H10D 62/85*** | (2025.01) |
| ***H10D 64/27*** | (2025.01) |

(52) U.S. Cl.

CPC ....... *H10D 30/4755* (2025.01); *H10D 30/015* (2025.01); *H10D 62/8503* (2025.01); *H10D 64/411* (2025.01)

(58) Field of Classification Search

CPC ............. H10D 30/4755; H10D 30/015; H10D 62/8503; H10D 64/411; H10D 62/343; H10D 64/513; H10D 64/685; H10D 30/473; H10D 62/151; H10D 62/405

See application file for complete search history.

(56) References Cited

U.S. PATENT DOCUMENTS

2018/0342588 A1* 11/2018 Miki .................... H10D 30/015

FOREIGN PATENT DOCUMENTS

CN 104051523 A * 9/2014 ........... H10D 30/015
WO 2005/119787 12/2005

* cited by examiner

*Primary Examiner* — Elmito Breval
(74) *Attorney, Agent, or Firm* — IPUSA, PLLC

(57) ABSTRACT

A semiconductor device includes a barrier layer having a nitrogen polarity on an upper surface, a channel layer on the barrier layer, the channel layer having a nitrogen polarity on an upper surface, a first cap layer on the channel layer, the first cap layer having a nitrogen polarity on an upper surface, and a dielectric film in contact with the upper surface of the first cap layer. The first cap layer is an aluminum nitride layer.

8 Claims, 13 Drawing Sheets

SEMICONDUCTOR DEVICE

CROSS-REFERENCE TO RELATED APPLICATIONS

The present application claims priority under 35 U.S.C. § 119 to Japanese Patent Application No. 2023-141122, filed Aug. 31, 2023, and Japanese Patent Application No. 2023-169715, filed Sep. 29, 2023, the contents of which are incorporated herein by reference in their entireties.

BACKGROUND OF THE INVENTION

Field of the Invention

The present disclosure relates to a semiconductor device.

Description of the Related Art

Conventionally, a High Electron Mobility Transistor (HEMT) in which a channel layer is formed on a barrier layer has been proposed (for example, see International Publication No. WO 2005/119787).

SUMMARY OF THE INVENTION

A semiconductor device according to the present disclosure includes a barrier layer having a nitrogen polarity on an upper surface, a channel layer on the barrier layer, the channel layer having a nitrogen polarity on an upper surface, a first cap layer on the channel layer, the first cap layer having a nitrogen polarity on an upper surface, and a dielectric film in contact with the upper surface of the first cap layer, wherein the first cap layer is an aluminum nitride layer.

DETAILED DESCRIPTION

Figure 1:
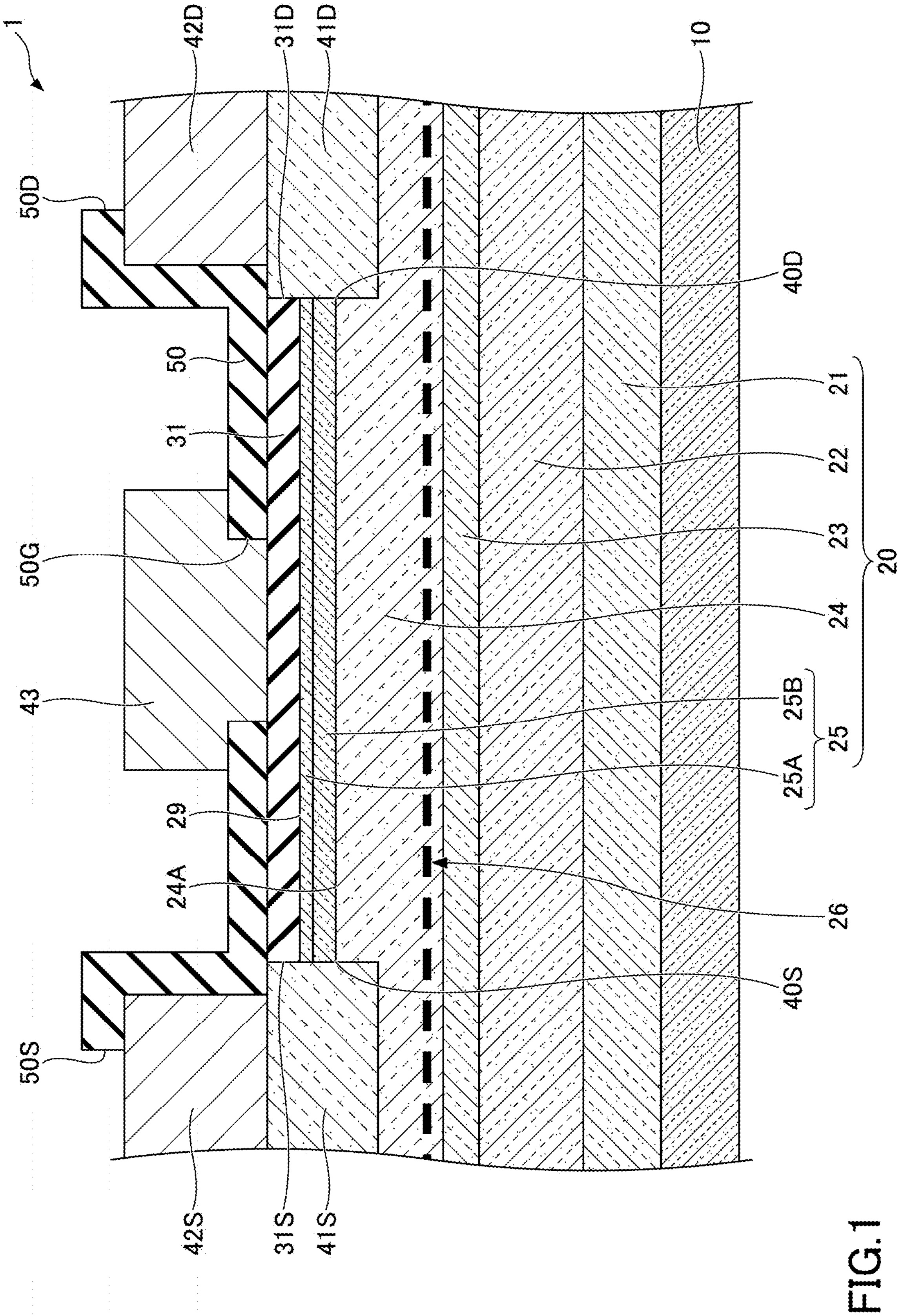
FIG. 1 is a cross-sectional view illustrating a semiconductor device according to an embodiment of the present disclosure.

Problem to be Solved by the Present Disclosure

Semiconductor devices such as GaN-based HEMTs are promising for Fifth Generation (5G) and Sixth Generation (6G) mobile communication systems. While GaN-based HEMTs widely used in the industry have a Gallium polarity (Ga polarity) on an upper surface thereof, GaN-based HEMTs alternatively with a nitrogen polarity (N polarity) are under research and development due to their higher potential for high power and high frequency characteristics. It is known that GaN-based HEMTs with the N polarity show current collapse same as the GaN-based HEMTs with the Ga polarity. There has been an increasing demand for suppression of current collapse.

Effects of the Present Disclosure

According to the present disclosure, current collapse can be reduced.

DESCRIPTION OF EMBODIMENTS OF THE DISCLOSURE

First, the embodiments of the disclosure will be described in a list form.

[1] A semiconductor device according to an embodiment of the present disclosure includes a barrier layer having a nitrogen polarity on an upper surface, a channel layer on the barrier layer, the channel layer having a nitrogen polarity on an upper surface, a first cap layer on the channel layer, the first cap layer having a nitrogen polarity on an upper surface, and a dielectric film in contact with the upper surface of the first cap layer, wherein the first cap layer is an aluminum nitride layer.

[2] A semiconductor device according to another embodiment of the present disclosure includes a barrier layer having a nitrogen polarity on an upper surface, a channel layer on the barrier layer, the channel layer having a nitrogen polarity on an upper surface, a first cap layer on the channel layer, the first cap layer having a nitrogen polarity on an upper surface, and a dielectric film in contact with the upper surface of the first cap layer, wherein a proportion of aluminum in Group III elements is 52% or more in the upper surface of the first cap layer.

When the first cap layer is an aluminum nitride layer or when the proportion of aluminum in the Group III elements is 52% or more in the upper surface of the first cap layer, excellent surface morphology can be obtained in the first cap layer. Therefore, electron traps existing in the surface of the first cap layer can be reduced and current collapse can be suppressed.

[3] In [1] or [2], a thickness of the first cap layer may be 0.2 nm or greater and less than 2.0 nm. In this case, it is possible to suppress an increase in sheet resistance while suppressing current collapse.

[4] In any one of [1] to [3], a second cap layer having a nitrogen polarity on an upper surface may be provided between the channel layer and the first cap layer, and a proportion of aluminum in the Group III elements in the second cap layer may be lower than the proportion of aluminum in the Group III elements in the first cap layer. In this case, even if a two-dimensional electron gas is reduced due to the first cap layer, a two-dimensional electron gas can be supplemented by the second cap layer.

In any one of [1] to [4], a gate electrode may be provided on the dielectric film. In this case, suppression of gate leakage is facilitated.

Details of the Embodiments of the Present Disclosure

The embodiments of the present disclosure will be described in detail below, but the present disclosure is not limited to as described below. In the present specification and the drawings, components having substantially the same functional configuration are denoted by the same reference numerals, so that redundant explanations may be omitted. In the present disclosure, viewing in a "plan view" means viewing an object from above.

The embodiments relate to a semiconductor device including a GaN-based high electron mobility transistor (HEMT). FIG. 1 is a cross-sectional view illustrating a semiconductor device according to an embodiment.

As illustrated in FIG. 1, a semiconductor device 1 according to an embodiment mainly includes a growth substrate 10, a nitride semiconductor layer 20, a dielectric film 31, a passivation film 50, a regrown layer 41S, a regrown layer 41D, a gate electrode 43, a source electrode 42S, and a drain electrode 42D.

The growth substrate 10 is, for example, a semi-insulating silicon carbide (SiC) substrate. When the growth substrate 10 is an SiC substrate, the upper surface of the growth substrate 10 is a carbon (C)-polar surface. When the surface of the growth substrate 10 is a C-polar surface, the nitride semiconductor layer 20 can be crystal-grown with a nitrogen (N)-polar plane oriented as a growth plane.

The nitride semiconductor layer 20 includes a buffer layer 21, a barrier layer 22, a spacer layer 23, a channel layer 24, and a cap layer 25. The nitride semiconductor layer 20 may include a nucleation layer between the growth substrate 10 and the buffer layer 21.

The buffer layer 21 is on the growth substrate 10. The buffer layer 21 is, for example, an aluminum nitride (AlN) layer. The thickness of the AlN layer is, for example, 1 nm or greater and 2,000 nm or less. The buffer layer 21 may include an AlN layer, and a GaN layer or an aluminum gallium nitride (AlGaN) layer on the AlN layer.

The barrier layer 22 is on the buffer layer 21. The barrier layer 22 is, for example, an AlGaN layer. The band gap of the barrier layer 22 is larger than the band gap of the channel layer 24. The thickness of the barrier layer 22 is, for example, 1 nm or greater and 50 nm or less. The composition of the barrier layer 22 is, for example, $Al_YGa_{1-Y}N$ ($0.15 \le Y \le 0.55$). The conductivity type of the barrier layer 22 is, for example, an n-type or an undoped type (i-type). Instead of the AlGaN layer, a scandium aluminum nitride (ScAlN) layer, an indium aluminum nitride (InAlN) layer, or an indium aluminum gallium nitride (InAlGaN) layer may be used. When the composition of the barrier layer 22 is $Al_YGa_{1-Y}N$, the proportion of Al in the Group III elements in the barrier layer 22 is Y×100%.

The spacer layer 23 is on the barrier layer 22. The spacer layer 23 is, for example, an AlN layer. The thickness of the spacer layer 23 is, for example, in a range of 0.2 nm or greater and 5 nm or less.

The channel layer 24 is on the spacer layer 23. The channel layer 24 is, for example, a GaN layer. The band gap of the channel layer 24 is smaller than the band gap of the barrier layer 22. The thickness of the channel layer 24 is, for example, 1 nm or greater and 50 nm or less. Strains occur at the channel layer 24, and the barrier layer 22 and spacer layer 23 due to the difference in their lattice constants, and the strains induce a piezo charge at the interface between them. As a result, a two-dimensional electron gas (2DEG) is generated in the channel layer 24 near a surface thereof facing the barrier layer 22, to form a channel region 26. The conductivity type of the channel layer 24 is, for example, an n-type or an undoped type (i-type).

The cap layer 25 includes a second cap layer 25B and a first cap layer 25A. The second cap layer 25B is on the channel layer 24. The first cap layer 25A is on the second cap layer 25B. For example, the second cap layer 25B is an AlGaN layer, and the first cap layer 25A is an aluminum nitride (AlN) layer. The composition of the second cap layer 25B is, for example, $Al_XGa_{1-X}N$ ($0.15 \le X \le 0.55$). For example, the thickness of the second cap layer 25B is 0.2 nm or greater and 10 nm or less, and the thickness of the first cap layer 25A is 0.2 nm or greater and less than 2.0 nm. When the composition of the second cap layer 25B is $Al_XGa_{1-X}N$, the proportion of Al in the Group III elements in the second cap layer 25B is X×100%.

On the C-polar surface of the SiC substrate, the buffer layer 21, the barrier layer 22, the spacer layer 23, the channel layer 24, the second cap layer 25B, and the first cap layer 25A are crystal-grown with N-polar planes oriented as growth planes. Accordingly, the upper surface of each of the buffer layer 21, the barrier layer 22, the spacer layer 23, the channel layer 24, the second cap layer 25B, and the first cap layer 25A has an N-polarity, and the lower surface of each of them has a gallium (Ga) polarity or an aluminum (Al) polarity.

A source recess 40S and a drain recess 40D are formed in the nitride semiconductor layer 20. The bottom of the recess 40S and the bottom of the recess 40D are closer to the lower surface of the nitride semiconductor layer 20 than is an upper surface 24A of the channel layer 24. That is, the recess 40S and the recess 40D are formed to a depth greater than that of the upper surface 24A of the channel layer 24. The bottom of the recess 40S and the bottom of the recess 40D may be in the channel layer 24, or in the spacer layer 23, or in the barrier layer 22.

The dielectric film 31 is on the nitride semiconductor layer 20. The dielectric film 31 is in contact with an upper surface 29 of the first cap layer 25A. For example, the relative permittivity of the dielectric film 31 is higher than the relative permittivity of silicon dioxide ($SiO_2$). The dielectric film 31 may be a high-permittivity film. The dielectric film 31 is, for example, a silicon nitride (SiN) film. The dielectric film 31 may be a dielectric oxide film or a dielectric oxynitride film. The dielectric oxide film or the dielectric oxynitride film may contain at least one selected from the group consisting of hafnium (Hf), lanthanum (La), and zirconium (Zr). The dielectric oxide film or the dielectric oxynitride film may contain either one or both selected from the group consisting of silicon (Si) and aluminum (Al). For example, the dielectric film 31 may be a hafnium silicate ($HfSiO_x$) film, a hafnium aluminate ($HfAlO_x$) film, a hafnium silicon oxynitride (HfSiON) film, or a hafnium aluminum oxynitride (HfAlON) film. The thickness of the dielectric film 31 is, for example, 1 nm or greater and 30 nm or less. A source opening 31S and a drain opening 31D are formed in the dielectric film 31. The opening 31S leads to the recess 40S, and the opening 31D leads to the recess 40D.

The regrown layer 41S is on the channel layer 24, the spacer layer 23, or the barrier layer 22 in the recess 40S. The regrown layer 41D is on the channel layer 24, the spacer layer 23, or the barrier layer 22 in the recess 40D. The regrown layer 41S and the regrown layer 41D are, for example, n-type GaN layers. The regrown layer 41S and the regrown layer 41D contain germanium (Ge) or Si as an n-type impurity. The electrical resistance of the regrown layer 41S and the regrown layer 41D is lower than the electrical resistance of the channel layer 24. For example, the regrown layer 41S and the regrown layer 41D are formed by regrowth of an n-type GaN layer after formation of the recess 40S and the recess 40D in the nitride semiconductor layer 20.

The source electrode 42S is on the regrown layer 41S, and the drain electrode 42D is on the regrown layer 41D. The source electrode 42S is in contact with the regrown layer 41S, and the drain electrode 42D is in contact with the regrown layer 41D. The source electrode 42S is in ohmic contact with the regrown layer 41S, and the drain electrode 42D is in ohmic contact with the regrown layer 41D.

The passivation film 50 covers the dielectric film 31, the regrown layer 41S, the regrown layer 41D, the source electrode 42S, and the drain electrode 42D. The passivation film 50 is, for example, a SiN film. The thickness of the passivation film 50 is, for example, 5 nm or greater and 50 nm or less in a uniform thickness portion on the dielectric film 31. A source opening 50S, a drain opening 50D, and a gate opening 50G are formed in the passivation film 50. A part of the source electrode 42S is exposed from the opening 50S, and a part of the drain electrode 42D is exposed from the opening 50D. In a plan view, the opening 50G is located between the opening 50S and the opening 50D. A part of the dielectric film 31 is exposed from the opening 50G.

In a plan view, the gate electrode 43 is located between the source electrode 42S and the drain electrode 42D. The gate electrode 43 is located on the passivation film 50 and the dielectric film 31, and is in contact with the dielectric film 31 through the opening 50G.

Next, a method of manufacturing the semiconductor device 1 according to the embodiment will be described. FIG. 2 to FIG. 7 are cross-sectional views illustrating a method of manufacturing the semiconductor device 1 according to the embodiment.

Figure 2:
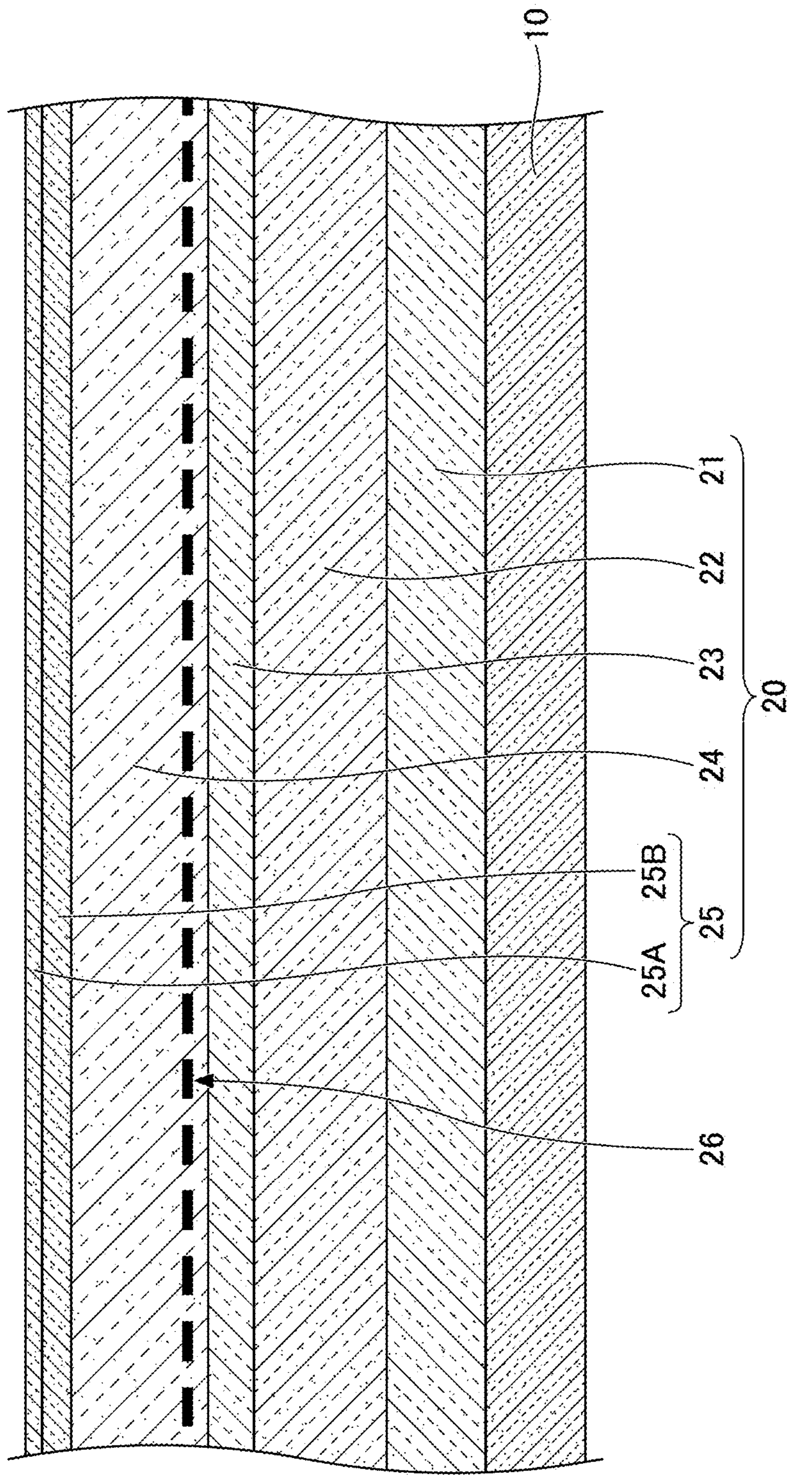
FIG. 2 is a cross-sectional view (part 1) illustrating a method of manufacturing a semiconductor device according to an embodiment of the present disclosure.

First, as illustrated in FIG. 2, the nitride semiconductor layer 20 is formed on the growth substrate 10 by, for example, a Metal Organic Chemical Vapor Deposition (MOCVD) method. In the formation of the nitride semiconductor layer 20, the buffer layer 21, the barrier layer 22, the spacer layer 23, the channel layer 24, the second cap layer 25B, and the first cap layer 25A are sequentially formed. The first cap layer 25A is formed at a temperature of, for example, 700° C. or higher. The buffer layer 21, the barrier layer 22, the spacer layer 23, the channel layer 24, and the second cap layer 25B may also be formed at the same temperature as that of the first cap layer 25A.

Figure 3:
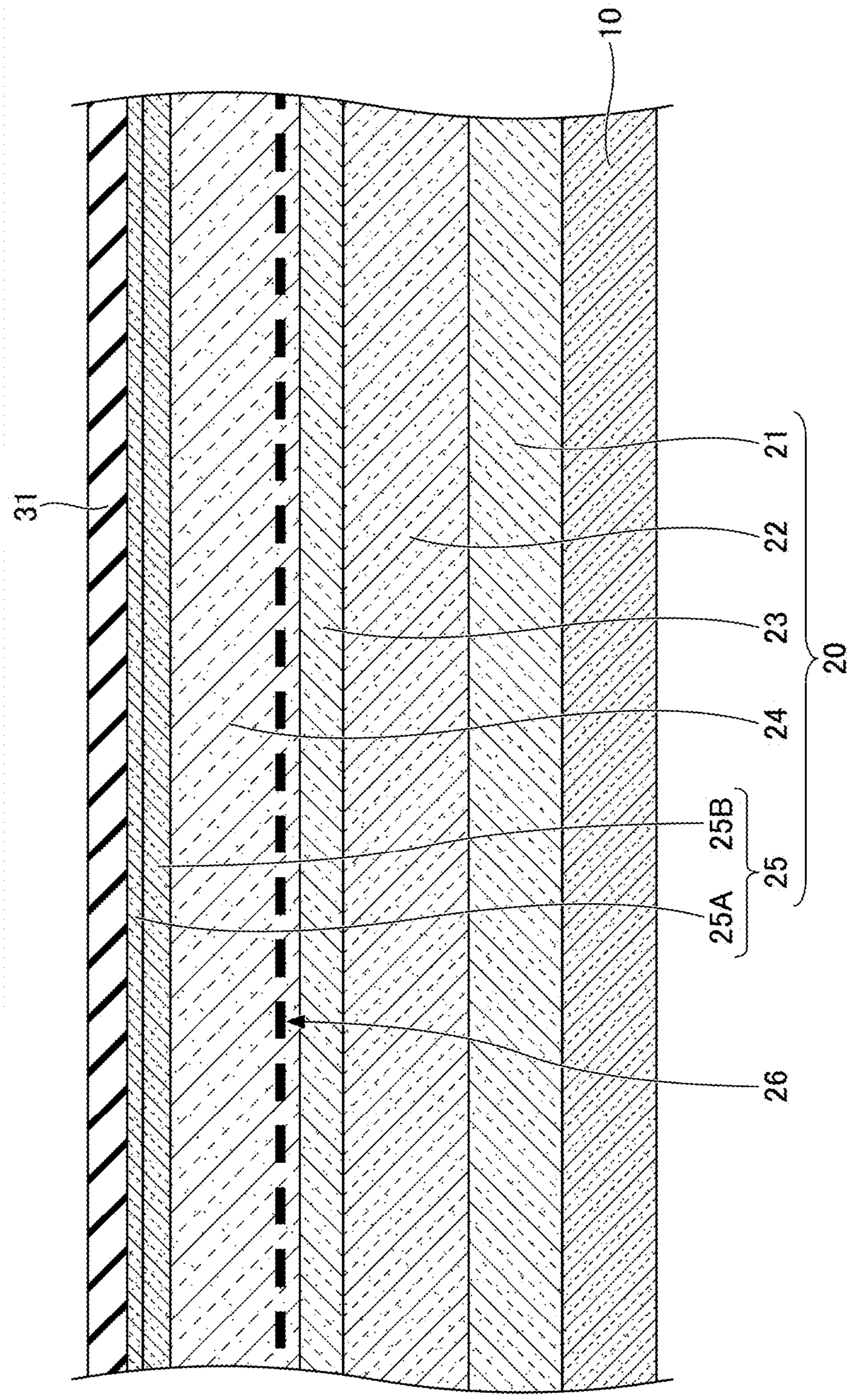
FIG. 3 is a cross-sectional view (part 2) illustrating a method of manufacturing a semiconductor device according to an embodiment of the present disclosure.

Next, as illustrated in FIG. 3, the dielectric film 31 is formed on the nitride semiconductor layer 20.

Figure 4:
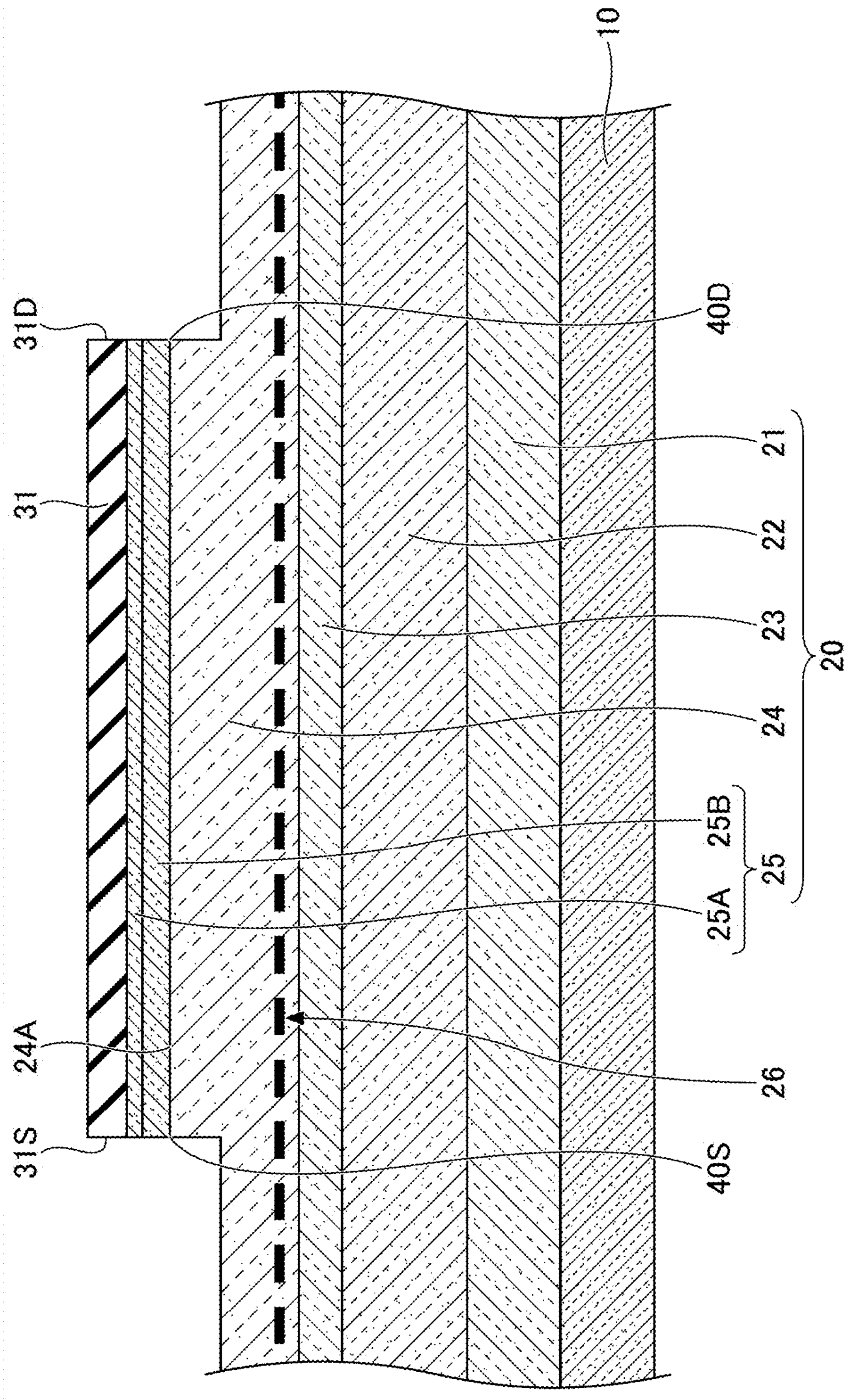
FIG. 4 is a cross-sectional view (part 3) illustrating a method of manufacturing a semiconductor device according to an embodiment of the present disclosure.

Next, as illustrated in FIG. 4, the source opening 31S and the drain opening 31D are formed in the dielectric film 31, and the source recess 40S and the drain recess 40D are formed in the nitride semiconductor layer 20. The bottom of the recess 40S and the bottom of the recess 40D may be closer to the lower surface of the nitride semiconductor layer 20 than is the upper surface 24A of the channel layer 24. That is, the recess 40S and the recess 40D may be formed to a depth greater than that of the upper surface 24A of the channel layer 24. The bottom of the recess 40S and the bottom of the recess 40D may be in the channel layer 24, or in the spacer layer 23, or in the barrier layer 22. The opening 31S, the opening 31D, the recess 40S, and the recess 40D may be formed, for example, by Reactive Ion Etching (RIE) using a mask (not illustrated).

Figure 5:
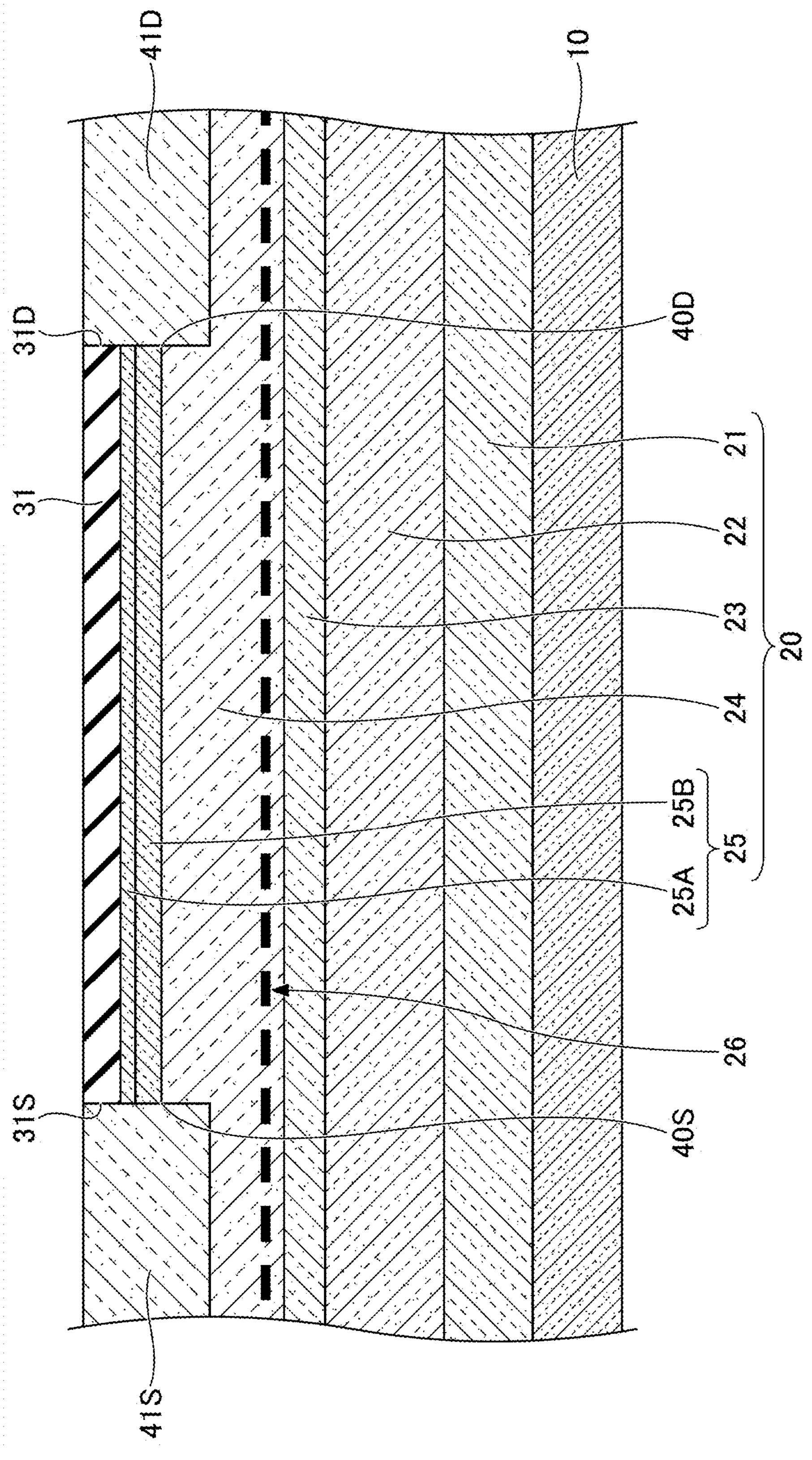
FIG. 5 is a cross-sectional view (part 4) illustrating a method of manufacturing a semiconductor device according to an embodiment of the present disclosure.

Next, as illustrated in FIG. 5, the regrown layer 41S is formed on the channel layer 24, the spacer layer 23, or the barrier layer 22 in the recess 40S, and the regrown layer 41D is formed on the channel layer 24, the spacer layer 23, or the barrier layer 22 in the recess 40D. The regrown layer 41S and the regrown layer 41D may be formed by, for example, a Physical Vapor Deposition (PVD) method, such as a vapor deposition method, a sputtering method, or a Molecular Beam Epitaxy (MBE) method, or a metal organic chemical vapor deposition (MOCVD) method.

Figure 6:
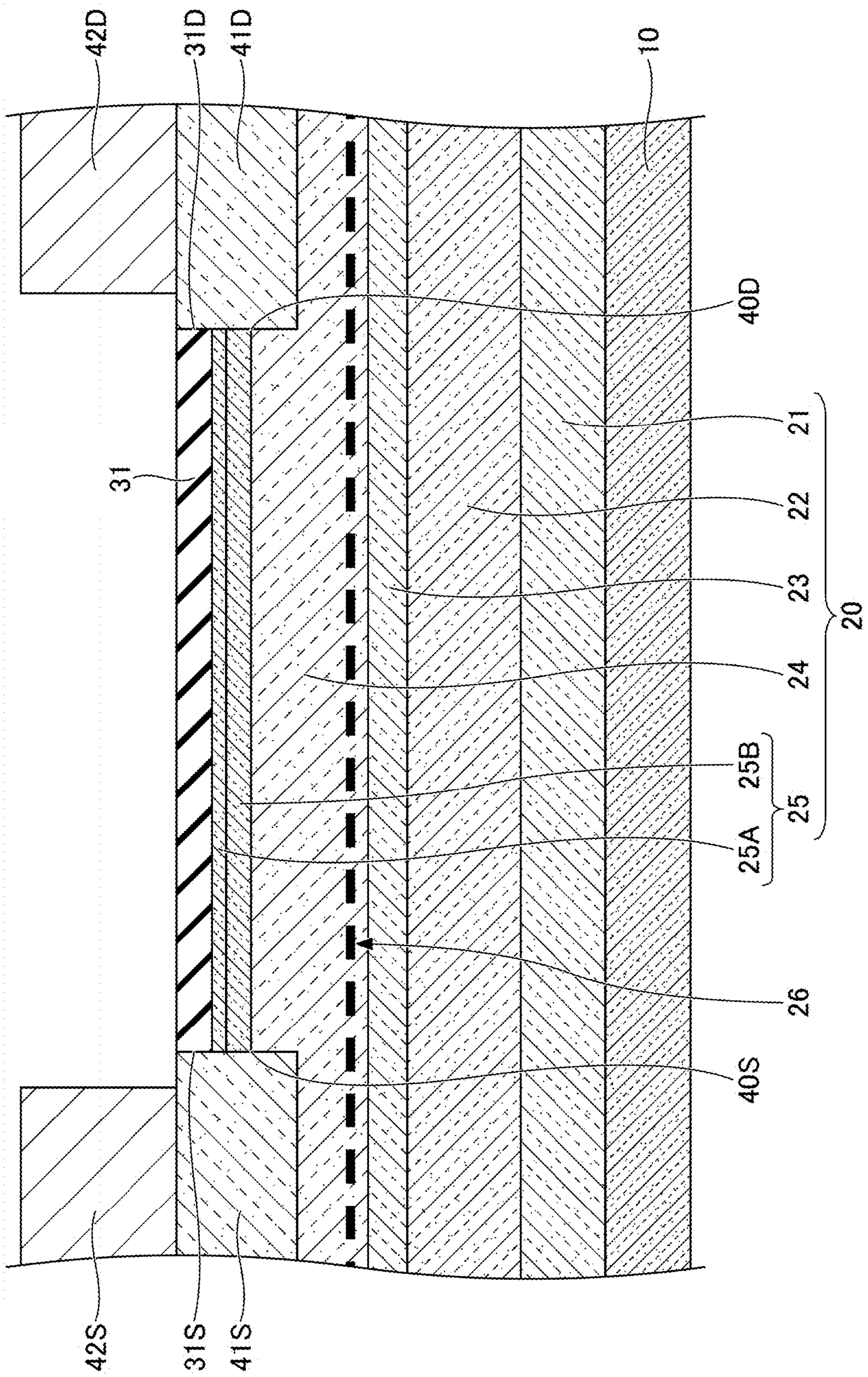
FIG. 6 is a cross-sectional view (part 5) illustrating a method of manufacturing a semiconductor device according to an embodiment of the present disclosure.

Next, as illustrated in FIG. 6, the source electrode 42S is formed on the regrown layer 41S, and the drain electrode 42D is formed on the regrown layer 41D. In the formation of the source electrode 42S and the drain electrode 42D, first, a metal layer (not illustrated) constituting the source electrode 42S and the drain electrode 42D is formed. In the formation of the metal layer, for example, film formation is performed using a growth mask (not illustrated) in which an opening is formed in a region corresponding to where the metal layer is to be formed, and then the growth mask is removed together with the metal layer (not illustrated) formed thereon. That is, lift-off is performed.

Figure 7:
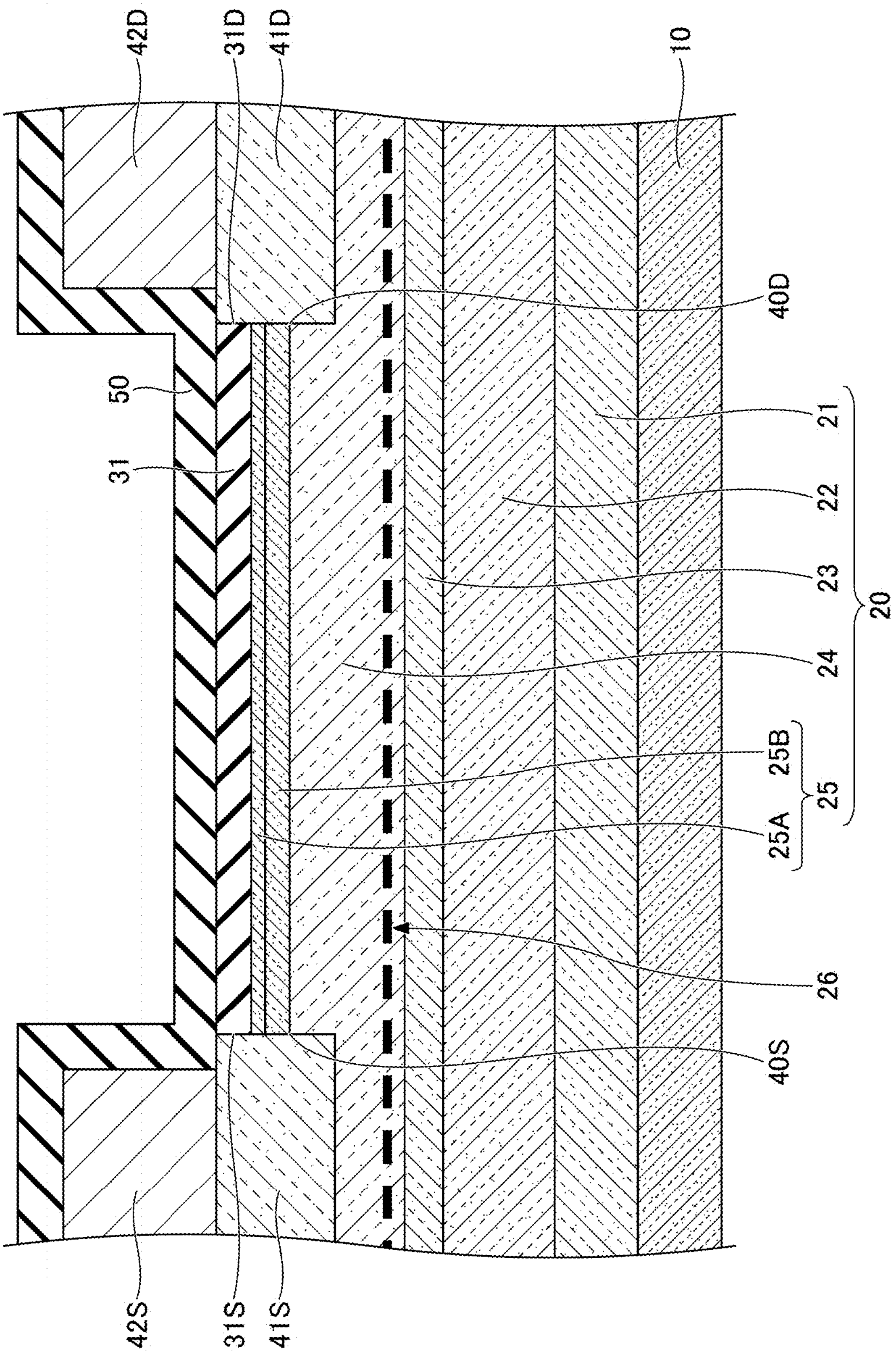
FIG. 7 is a cross-sectional view (part 6) illustrating a method of manufacturing a semiconductor device according to an embodiment of the present disclosure.

Next, as illustrated in FIG. 7, the passivation film 50 is formed on the dielectric film 31, the regrown layer 41S, the regrown layer 41D, the source electrode 42S, and the drain electrode 42D. The passivation film 50 covers the dielectric film 31, the regrown layer 41S, the regrown layer 41D, the source electrode 42S, and the drain electrode 42D.

Next, the gate opening 50G is formed in the passivation film 50 (see FIG. 1). The opening 50G may be formed, for example, by RIE using a mask (not illustrated).

Next, the gate electrode 43 to be in contact with the dielectric film 31 through the opening 50G is formed on the passivation film 50 and the dielectric film 31 (see FIG. 1). In the formation of the gate electrode 43, for example, a metal layer is formed using a growth mask (not illustrated) in which an opening is formed in a region corresponding to where the gate electrode 43 is to be formed, and then the growth mask is removed together with the metal layer (not illustrated) formed thereon. That is, lift-off is performed.

Next, the source opening 50S and the drain opening 50D are formed in the passivation film 50 (see FIG. 1). The openings 50S and 50D may be formed by, for example, RIE using a mask (not illustrated).

In this way, the semiconductor device 1 can be manufactured.

In the semiconductor device 1 according to the embodiment, the polarity of the upper surfaces of the barrier layer 22 and the channel layer 24 being the N polarity facilitates reducing the distance between the channel region 26 and the source electrode 42S and drain electrode 42D, and facilitates realization of a lower resistance.

Further, since the first cap layer 25A, which is a layer in contact with the dielectric film 31, i.e., the last layer that is formed in the nitride semiconductor layer 20, is an AlN layer, excellent surface morphology can be obtained in the nitride semiconductor layer 20. Therefore, it is possible to reduce electron traps existing in the surface of the nitride semiconductor layer 20, and to suppress current collapse.

In addition, the gate electrode 43 being provided on the dielectric film 31 and forming a Metal Insulator Semiconductor (MIS) structure facilitates suppression of gate leakage.

Note that the first cap layer 25A does not need to be an AlN layer. Even if the first cap layer 25A is an AlGaN layer, excellent surface morphology can be obtained on the nitride semiconductor layer 20 as long as the proportion of Al in the Group III elements is 52% or more, i.e., the Al composition ratio is 0.52 or more, in the upper surface 29 of the first cap layer 25A. In the upper surface 29, the proportion of Al in the Group III elements may be 90% or more, i.e., the Al composition ratio may be 0.9 or more, or the proportion of Al in the Group III elements may be 95% or more, i.e., the Al composition ratio may be 0.95 or more. A higher Al composition ratio tends to provide a higher thermal cracking resistance and a better surface morphology in the first cap layer 25A. However, stable formation of an AlGaN layer in which the Al composition ratio is high is difficult, whereas an AlN layer has an advantage of being easy to form.

The Al composition ratio in the nitride semiconductor layer can be measured by X-Ray Diffraction (XRD) or Energy Dispersive X-ray Spectroscopy.

When the thickness of the first cap layer 25A is less than 0.2 nm, it is less than the thickness of a unimolecular layer, which may make it difficult to obtain the current collapse suppressing effect of the first cap layer 25A. When the thickness of the first cap layer 25A is 2.0 nm or greater, 2DEG in the channel region 26 decreases, and the sheet resistance increases. When the thickness of the first cap layer 25A is less than 2.0 nm, the sheet resistance can be suppressed to be low. The thickness of the first cap layer 25A may be 0.2 nm or greater and 1.0 nm and less, 0.2 nm or greater and 0.9 nm or less, and 0.2 nm or greater and 0.8 nm or less. The thickness of the first cap layer 25A may be 0.3 nm or greater and 1.9 nm or less, and 0.4 nm or greater and 1.8 nm or less.

When the temperature at which the first cap layer 25A is formed is 700° C. or higher, excellent surface morphology tends to be obtained in the first cap layer 25A. The temperature at which the first cap layer 25A is formed may be 800° C. or higher, and may be 900° C. or higher.

Furthermore, since the second cap layer 25B having an Al composition ratio lower than that of the first cap layer 25A is provided between the channel layer 24 and the first cap layer 25A, a decrease in 2DEG due to the first cap layer 25A can be made up by the second cap layer 25B. Therefore, an increase in the sheet resistance can be suppressed. Even if the first cap layer 25A is an AlGaN layer, a decrease in 2DEG can be made up by the second cap layer 25B, as long as the Al composition ratio in the second cap layer 25B is lower than the Al composition ratio in the first cap layer 25A. Note that the nitride semiconductor layer 20 does not need to include the second cap layer 25B, and the first cap layer 25A may be in contact with the upper surface of the channel layer 24.

Figure 8:
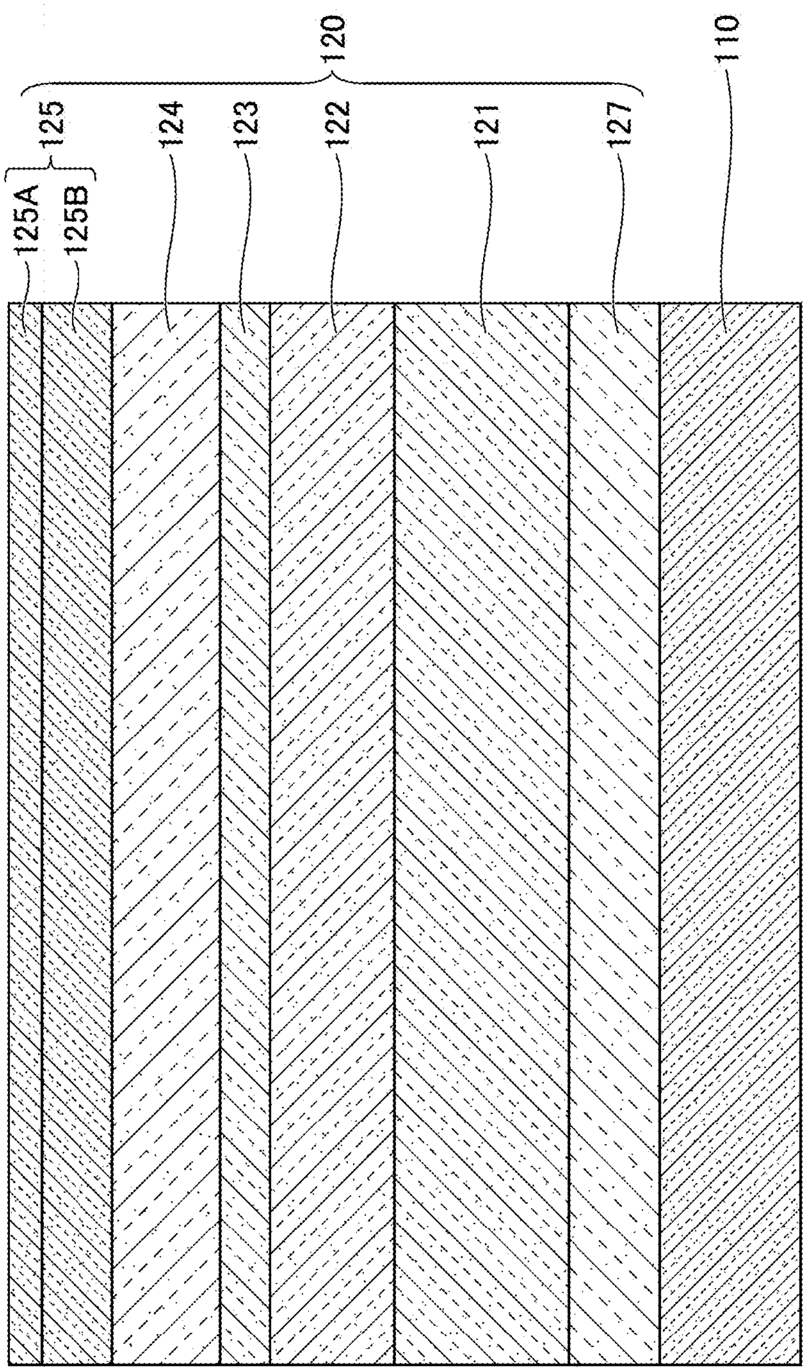
FIG. 8 is a cross-sectional view illustrating the basic structure of an epitaxial substrate used in an experiment.

The results of the experiments conducted by the inventors of the present invention will now be described. FIG. 8 is a cross-sectional view illustrating the basic structure of an epitaxial substrate used in the experiments. As illustrated in FIG. 8, the basic structure of the epitaxial substrate used in the experiments includes the growth substrate 110 and the nitride semiconductor layer 120. The growth substrate 110 is an SiC substrate of which the upper surface is a C-polar plane. The nitride semiconductor layer 120 includes a nucleation layer 127, the buffer layer 121, the barrier layer 122, the spacer layer 123, the channel layer 124, and the cap layer

125. The nucleation layer 127 is on the growth substrate 110. The buffer layer 121 is on the nucleation layer 127. The barrier layer 122 is on the buffer layer 121. The spacer layer 123 is on the barrier layer 122. The channel layer 124 is on the spacer layer 123. The cap layer 125 includes the second cap layer 125B and the first cap layer 125A. The second cap layer 125B is on the channel layer 124. The first cap layer 125A is on the second cap layer 125B. The upper surface of each of the nucleation layer 127, the buffer layer 121, the barrier layer 122, the spacer layer 123, the channel layer 124, the second cap layer 125B, and the first cap layer 125A has an N polarity, and the lower surface of each of them has a Ga polarity or an Al polarity.

(First Experiment)

In the first experiment, using epitaxial substrates in which the cap layer 125 did not include the second cap layer 125B and the first cap layer 125A was in contact with the upper surface of the channel layer 124, difference in the surface morphology due to difference in the Al composition ratio in the first cap layer 125A was examined. Specifically, two types of epitaxial substrates (Samples No. 1 and No. 2) were prepared. In the Sample No. 1, an AlGaN layer having an Al composition ratio of 0.2 was formed as the first cap layer 125A. In the Sample No. 2, an AlN layer having an Al composition ratio of 1.0 was formed as the first cap layer 125A. The Samples No. 1 and No. 2 were identical in other configurational respects.

Figure 9:
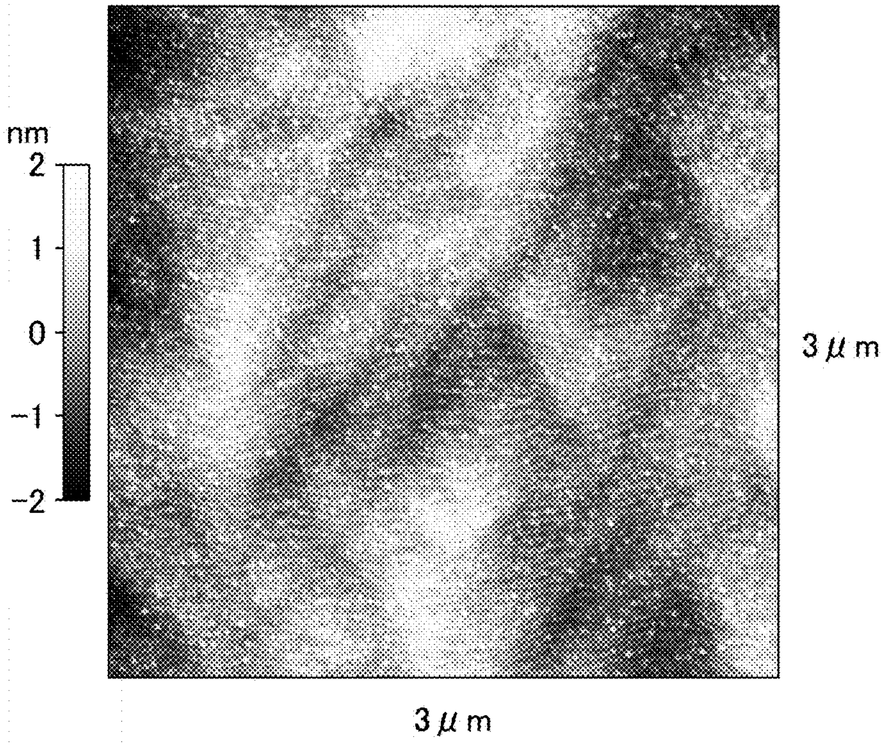
FIG. 9 is a view (part 1) illustrating an atomic force microscope image.
Figure 10:
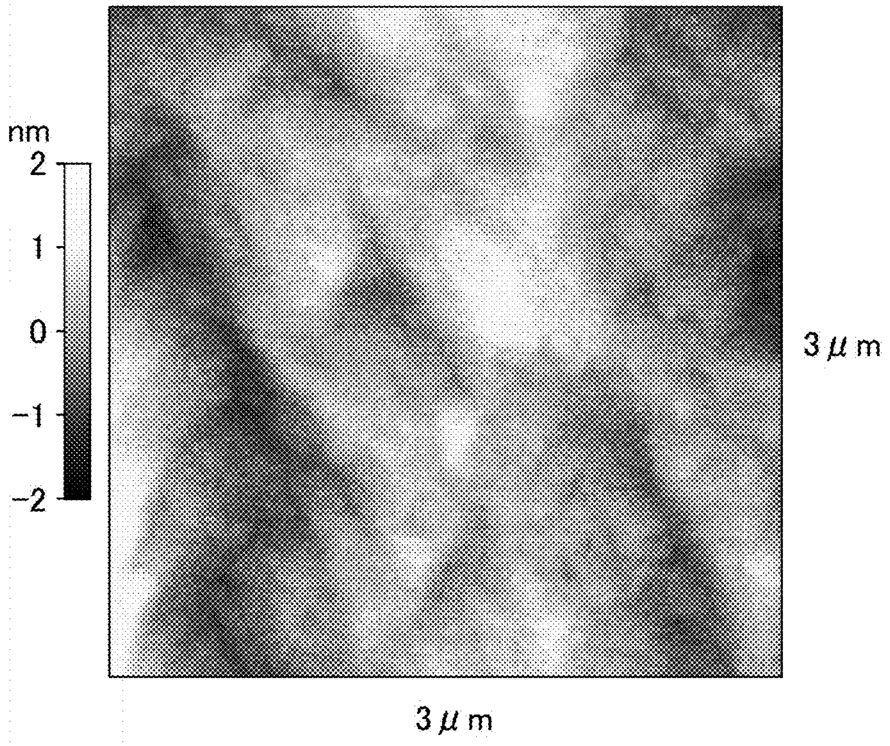
FIG. 10 is a view (part 2) illustrating an atomic force microscope image.

The surface morphologies of the Samples No. 1 and No. 2 were observed using an Atomic Force Microscope (AFM). The results are illustrated in FIGS. 9 and 10. FIG. 9 is a view illustrating an AFM image of the Sample No. 1. FIG. 10 is a view illustrating an AFM image of the Sample No. 2. As illustrated in FIG. 9 and FIG. 10, the surface morphology obtained in the Sample No. 2 was better than that of the Sample No. 1.

(Second Experiment)

In the second experiment, epitaxial substrates varied in the configuration of the cap layer 125 were used. The first cap layer 125A was an AlN layer having a thickness of 0.25 nm, and the second cap layer 125B was an AlGaN layer or an AlN layer having a thickness of 2 nm. Under a condition A, the cap layer 125 shall not include the first cap layer 125A and shall only include the second cap layer 125B. Under a condition B, the cap layer 125 shall not include the second cap layer 125B and shall only include the first cap layer 125A, and the first cap layer 125A shall be in contact with the upper surface of the channel layer 124. Under a condition C, the cap layer 125 shall include the first cap layer 125A and the second cap layer 125B. The Al composition ratio in the second cap layer 125B under the condition C shall be 0.2.

Figure 11:
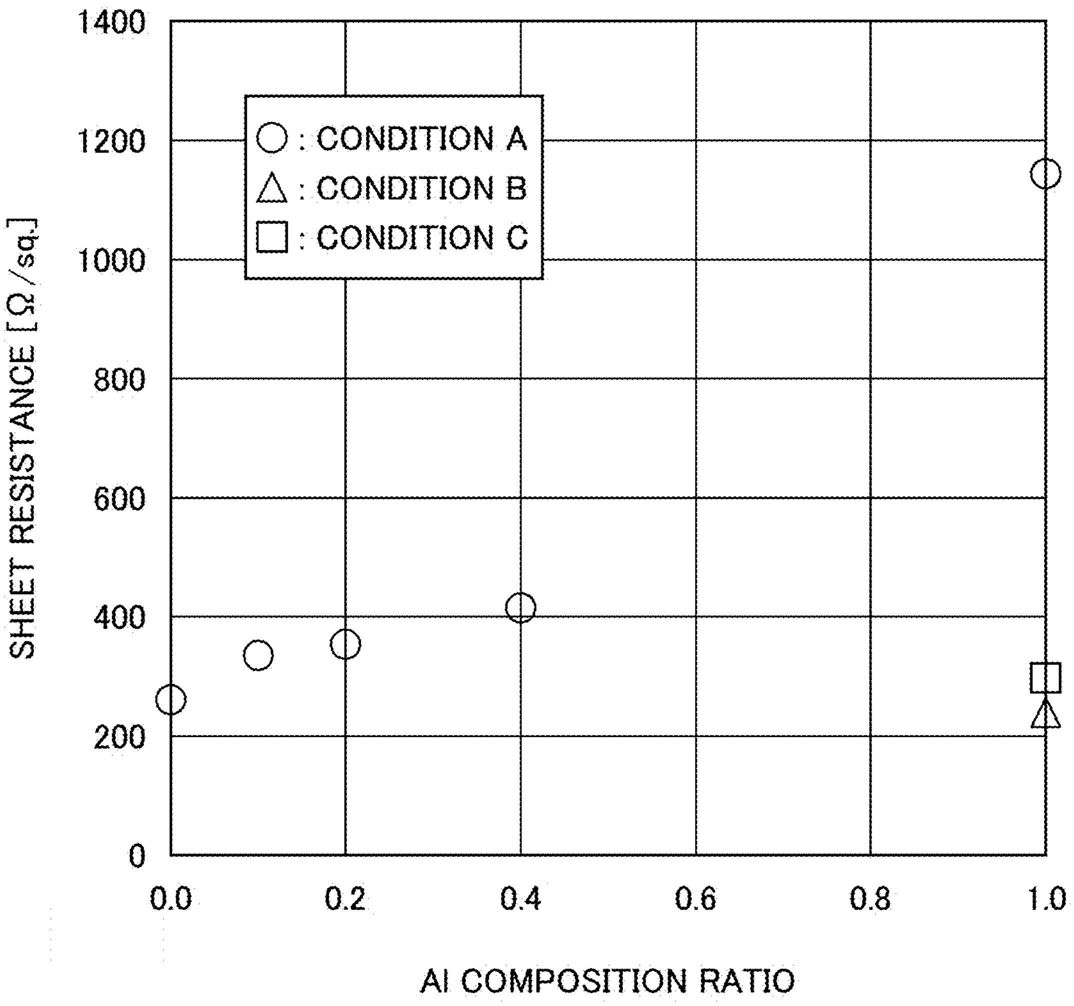
FIG. 11 is a graph illustrating a relationship between aluminum composition ratio and sheet resistance.

Then, the sheet resistance of each epitaxial substrate was measured. The results are illustrated in FIG. 11. FIG. 11 is a graph illustrating the relationship between the Al composition ratio and the sheet resistance. In FIG. 11, the Al composition ratio on the horizontal axis indicates the Al composition ratio in the upper surface of the nitride semiconductor layer 120.

As illustrated in FIG. 11, under the condition A, the higher the Al composition ratio in the second cap layer 125B, the higher the sheet resistance. This is because the higher the Al composition ratio, the more likely the 2DEG would decrease, on the condition that the thickness of the second cap layer 125B was 2 nm. Under the conditions B and C, even though the Al composition ratio in the first cap layer 125A was 1.0, the sheet resistance was low. This is because the thickness of the first cap layer 125A being 0.25 nm was not likely to decrease the 2DEG.

(Third Experiment)

In the third experiment, changes in the sheet resistance due to ultraviolet irradiation were measured. In the third experiment, two types of epitaxial substrates (Samples No. 3 and No. 4) were prepared. In the Sample No. 3, the cap layer 125 did not include the first cap layer 125A. In the Sample No. 4, the cap layer 125 included the first cap layer 125A and the second cap layer 125B. The first cap layer 125A was an AlN layer having a thickness of 0.25 nm. The second cap layer 125B was an AlGaN layer having a thickness of 2 nm, and the Al composition ratio in the second cap layer 125B was 0.2. The Samples No. 3 and No. 4 were identical in other configurational respects.

The sheet resistance of each epitaxial substrate was measured under two conditions, i.e., a condition D without ultraviolet irradiation and a condition E with ultraviolet irradiation. The ratio R of the sheet resistance measured under the condition D to the sheet resistance measured under the condition E was calculated. The results are indicated in Table 1.

TABLE 1

| Sample No. | First cap layer 125A | Second cap layer 125B | Sheet resistance (Ω/sq.) w/o irradiation | Sheet resistance (Ω/sq.) w/ irradiation | Ratio R |
|---|---|---|---|---|---|
| 3 | Absent | $Al_{0.2}Ga_{0.8}N$ | 336 | 258 | 1.30 |
| 4 | AlN | $Al_{0.2}Ga_{0.8}N$ | 299 | 247 | 1.21 |

As indicated in Table 1, the ratio R of the Sample No. 4 was smaller than that of the Sample No. 3. When a surface of a nitride semiconductor layer is irradiated with ultraviolet rays, electrons trapped in the electron traps existing in the surface of the nitride semiconductor layer would be emitted. Therefore, the ratio R being small means that there were few electron traps in the surface of the nitride semiconductor layer. From the results indicated in Table 1, it can be concluded that the Sample No. 4 including the first cap layer 125A had fewer electron traps than in the Sample No. 3 including no first cap layer 125A. Therefore, the Sample No. 4 could better suppress current collapse than the Sample No. 3.

(Fourth Experiment)

In the fourth experiment, changes in the sheet resistance due to ultraviolet irradiation were also measured. In the fourth experiment, two types of epitaxial substrates (Samples No. 5 and No. 6) were prepared. The Sample No. 5 did not include the cap layer 125, and the cap layer 125 of the Sample No. 6 did not include the second cap layer 125B. The first cap layer 125A was an AlN layer having a thickness of 0.25 nm. The Samples No. 5 and No. 6 were identical in other configurational respects. The difference between the Samples No. 3 and No. 4 and the Samples No. 5 and No. 6 lies in the configuration of the barrier layer 122.

The sheet resistance of each epitaxial substrate was measured under the same two conditions as in the third experiment. The ratio R of the sheet resistance measured under the condition D to the sheet resistance measured under the condition E was calculated. The results are indicated in Table 2.

TABLE 2

| Sample No. | First cap layer 125A | Second cap layer 125B | Sheet resistance (Ω/sq.) w/o irradiation | Sheet resistance (Ω/sq.) w/ irradiation | Ratio R |
|---|---|---|---|---|---|
| 5 | Absent | Absent | 271 | 246 | 1.10 |
| 6 | AlN | Absent | 235 | 231 | 1.02 |

As indicated in Table 2, the ratio R of the Sample No. 6 was smaller than that of the Sample No. 5. From the results indicated in Table 2, it can be concluded that the Sample No. 6 including the first cap layer 125A had fewer electron traps than in the Sample No. 5 including no first cap layer 125A. Therefore, the Sample No. 6 could better suppress current collapse than the Sample No. 5.

(Fifth Experiment)

Figure 12:
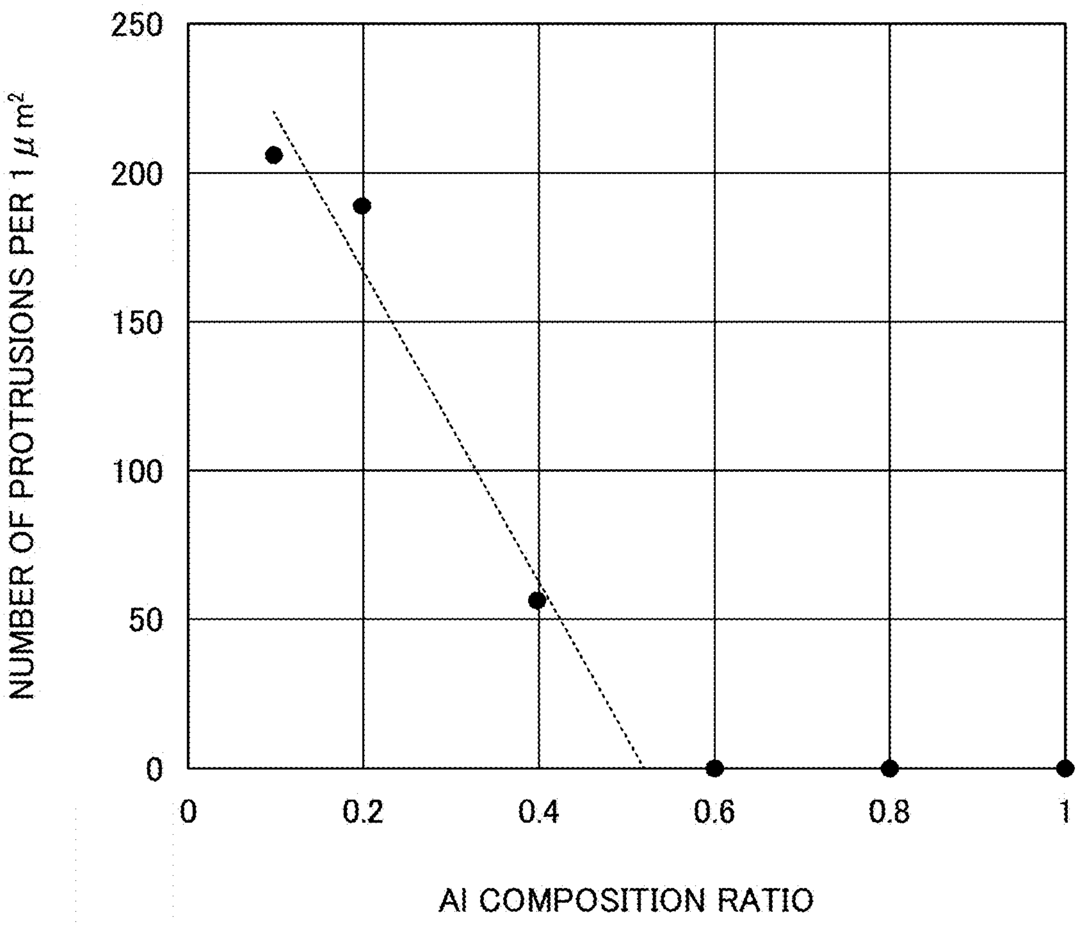
FIG. 12 is a graph illustrating a relationship between aluminum composition ratio and the number of protrusions.

In the fifth experiment, a plurality of samples having different Al composition ratios in the upper surface of the nitride semiconductor layer 120 were produced, and the number of protrusions existing on the upper surface was measured from AFM images of the upper surface. In the measurement of the number of protrusions, the AFM images were binarized using an appropriate threshold that was within a range of from −2 nm through +2 nm from a plane averaging the upper surface. Then, the number of protrusions per 1 $\mu m^2$ was calculated. The result is illustrated in FIG. 12. FIG. 12 illustrates the relationship between the Al composition ratio and the number of protrusions.

As illustrated in FIG. 12, the number of protrusions decreased as the Al composition ratio increased. In other words, the surface morphology improved as the Al composition ratio increased. In particular, the number of protrusions per 1 $\mu m^2$ was 0 when the Al composition ratio was 0.6 or more. As mentioned above, the higher the Al composition ratio, the fewer the electron traps. From what is described above, it can be concluded that improving the surface morphology contributes to reducing electron traps. In FIG. 12, the intercept on the horizontal axis is 0.52. From this result, it can be concluded that the surface morphology-improving effect and the electron trap-reducing effect are excellent when the Al composition ratio is 0.52 or more.

(Sixth Experiment)

Figure 13:
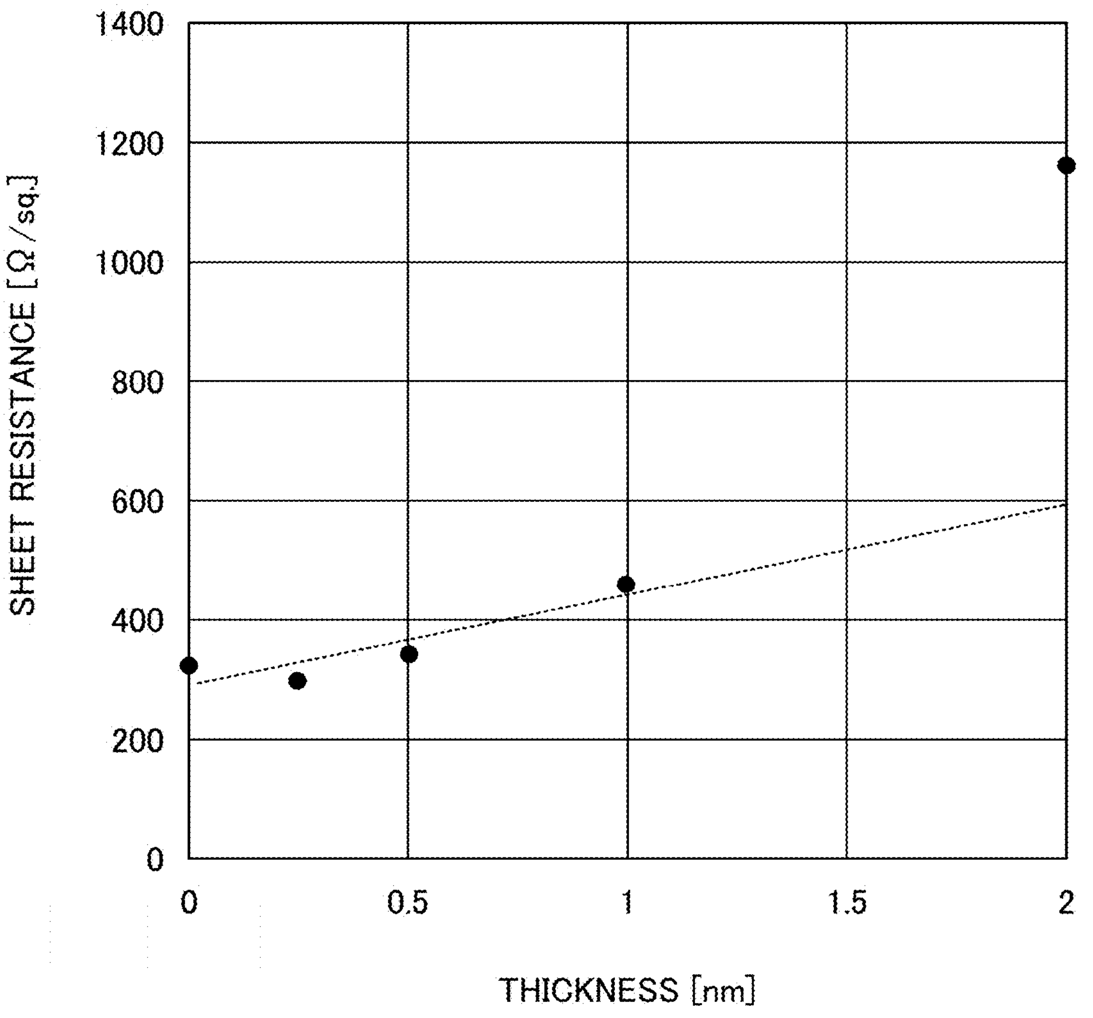
FIG. 13 is a graph illustrating a relationship between the thickness of an aluminum nitride layer and sheet resistance.

In the sixth experiment, epitaxial substrates, in which an AlGaN layer having an Al composition ratio of 0.2 and a thickness of 3 nm was used as the second cap layer 125B and an AlN layer was used as the first cap layer 125A, were used. The sheet resistance was measured with respect to changes in the thickness of the first cap layer 125A. The results are illustrated in FIG. 13. FIG. 13 is a graph illustrating the relationship between the thickness of the first cap layer 125A and the sheet resistance.

As illustrated in FIG. 13, the thicker the first cap layer 125A, the higher the sheet resistance. This is because, with the first cap layer 125A being an AlN layer, the 2DEG decreased with increased thickness of the first cap layer 125A. However, in the first cap layer 125A's thickness range of 1 nm or less, the increase in the sheet resistance was more moderate than in the thickness range greater than 1 nm.

Although the embodiments have been described above in detail, the present disclosure is not limited to the specific embodiments, and various modifications and changes are applicable within the scope of the claims.

What is claimed is:

1. A semiconductor device, comprising:

a barrier layer having a nitrogen polarity on an upper surface;

a channel layer on the barrier layer, the channel layer having a nitrogen polarity on an upper surface;

a first cap layer on the channel layer, the first cap layer having a nitrogen polarity on an upper surface; and a dielectric film in contact with the upper surface of the first cap layer, wherein the first cap layer is an aluminum nitride layer.

2. The semiconductor device according to claim 1, wherein a thickness of the first cap layer is 0.2 nm or greater and less than 2.0 nm.

3. The semiconductor device according to claim 1, further comprising:

a second cap layer between the channel layer and the first cap layer, the second cap layer having a nitrogen polarity on an upper surface, wherein a proportion of aluminum in Group III elements in the second cap layer is lower than a proportion of aluminum in the Group III elements in the first cap layer.

4. The semiconductor device according to claim 1, further comprising:

a gate electrode on the dielectric film.

5. A semiconductor device, comprising:

a barrier layer having a nitrogen polarity on an upper surface;

a channel layer on the barrier layer, the channel layer having a nitrogen polarity on an upper surface;

a first cap layer on the channel layer, the first cap layer having a nitrogen polarity on an upper surface; and a dielectric film in contact with the upper surface of the first cap layer, wherein a proportion of aluminum in Group III elements is 52% or more in the upper surface of the first cap layer.

6. The semiconductor device according to claim 2, wherein a thickness of the first cap layer is 0.2 nm or greater and less than 2.0 nm.

7. The semiconductor device according to claim 2, further comprising:

a second cap layer between the channel layer and the first cap layer, the second cap layer having a nitrogen polarity on an upper surface, wherein a proportion of aluminum in Group III elements in the second cap layer is lower than a proportion of aluminum in the Group III elements in the first cap layer.

8. The semiconductor device according to claim 2, further comprising:

a gate electrode on the dielectric film.

* * * * *